US007768117B2

(12) United States Patent
Haba et al.

(10) Patent No.: US 7,768,117 B2
(45) Date of Patent: Aug. 3, 2010

(54) MICROELECTRONIC PACKAGE HAVING INTERCONNECTED REDISTRIBUTION PATHS

(75) Inventors: Belgacem Haba, Saratoga, CA (US); Richard Dewitt Crisp, Castro Valley, CA (US); Masud Beroz, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 103 days.

(21) Appl. No.: 11/809,214

(22) Filed: May 30, 2007

(65) Prior Publication Data

US 2008/0296748 A1 Dec. 4, 2008

(51) Int. Cl.
*H01L 23/48* (2006.01)
*H01L 23/02* (2006.01)

(52) U.S. Cl. .............................. 257/691; 257/E23.079; 257/E23.151; 257/686; 257/678; 257/741; 257/773; 257/698; 257/203; 257/208; 257/207; 257/693; 257/664

(58) Field of Classification Search ................. 257/686, 257/692, 741, 773, E23.079, E23.151, 691, 257/698, 203, 211, 207, 693, 664
See application file for complete search history.

(56) References Cited

U.S. PATENT DOCUMENTS 3,579,056 A * 5/1971 TeVelde et al. .............. 257/506

| 5,570,504 | A | * | 11/1996 | DiStefano et al. | ............. 29/830 |
|---|---|---|---|---|---|
| 6,376,904 | B1 | | 4/2002 | Haba et al. | |
| 2003/0153122 | A1 | * | 8/2003 | Brooks | ........................ 438/107 |
| 2006/0166404 | A1 | * | 7/2006 | Corisis et al. | ............... 438/109 |
| 2007/0035036 | A1 | * | 2/2007 | Sota et al. | .................... 257/784 |
| 2008/0250628 | A1 | * | 10/2008 | Maeda et al. | .............. 29/602.1 |
| 2008/0265389 | A1 | * | 10/2008 | Hsu et al. | .................... 257/686 |
| 2008/0311702 | A1 | * | 12/2008 | Wark | .......................... 438/109 |

* cited by examiner

*Primary Examiner*—Alexander O Williams
(74) *Attorney, Agent, or Firm*—Lerner, David, Littenberg, Krumholz & Mentlik, LLP

(57) ABSTRACT

A microelectronic unit has a structure including a microelectronic element such as a semiconductor chip with a first contact disposed remote from the periphery of the structure. The unit further includes first and second redistribution conductive pads disposed near a periphery of the structure and a conductive path incorporating first and second conductors extending toward the first contact, these conductors being connected to one another adjacent the first contact. The conductive path is connected to the first contact, and can provide signal routing from the periphery of the unit to the contact without the need for long stubs. A package may include a plurality of such units, which may be stacked on one another with the redistribution conductive pads of the various units connected to one another.

18 Claims, 14 Drawing Sheets

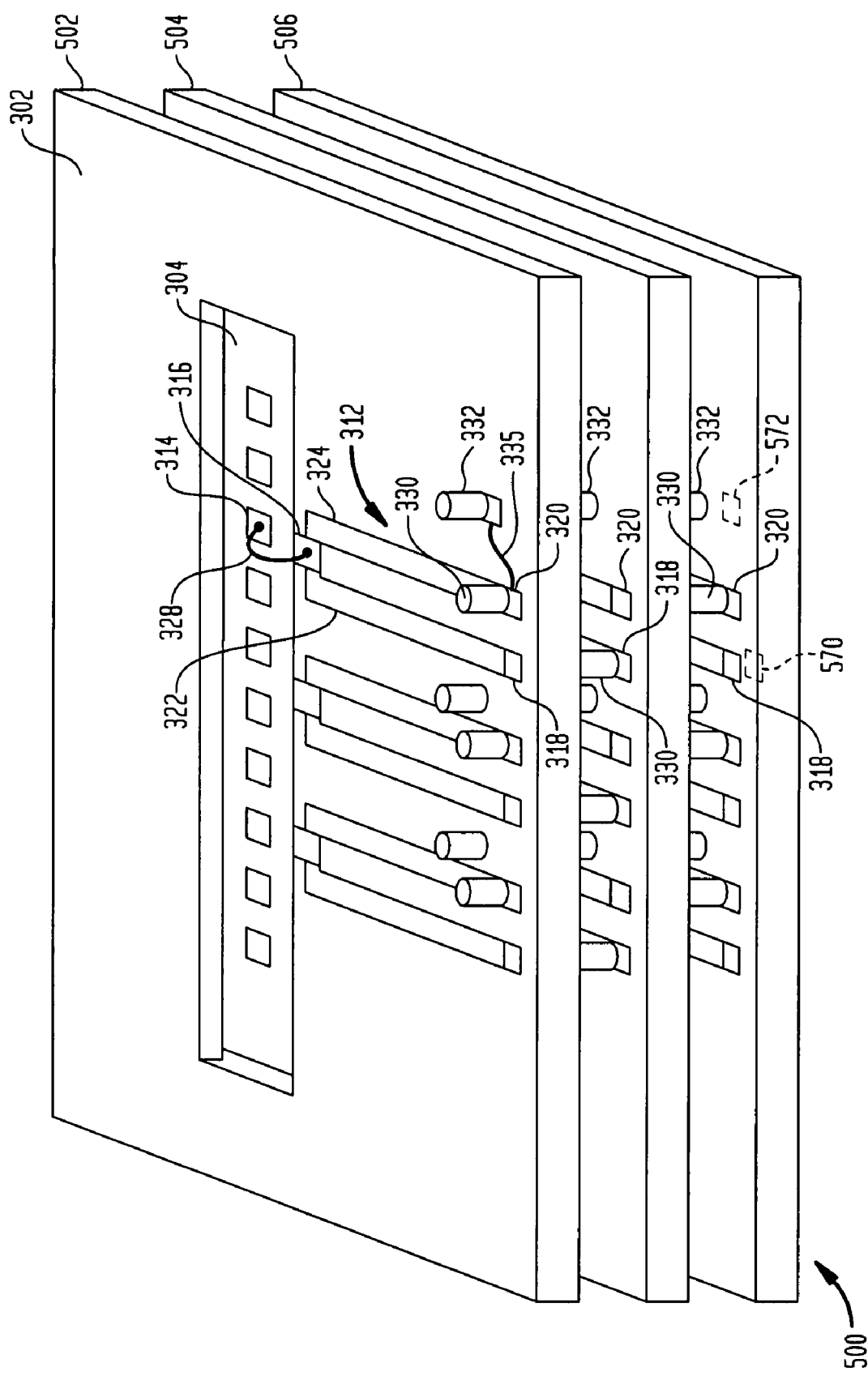

MICROELECTRONIC PACKAGE HAVING INTERCONNECTED REDISTRIBUTION PATHS

BACKGROUND

Microelectronic devices such as semiconductor chips (microelectronic elements) typically require many input and output connections to other electronic components. The input and output connections include contacts of a semiconductor chip which are generally disposed on grid-like patterns that substantially cover a surface of the device or in elongated rows which may extend parallel to and adjacent each edge of the front surface of the device, or in the center of the front surface. Typically, the devices or chips are physically mounted on a substrate such as a printed circuit board, and the contacts of the devices must be electrically connected to electrically conductive features of the circuit board.

Semiconductor chips are commonly provided in microelectronic packages, which facilitate handling of the chip during manufacturing and during mounting of the chip on an external substrate such as a circuit board or other circuit panel. For example, many semiconductor chips are provided in packages suitable for surface mounting. A common package includes a dielectric element, commonly referred to as a "chip carrier" or "substrate" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces.

A microelectronic package may include a single chip or may include a plurality of units, each incorporating one or more chips, stacked one on top of another along a vertical dimension. Such a stacked arrangement provides a compact package.

SUMMARY

One aspect of the present invention provides a microelectronic unit. A unit according to this aspect of the invention desirably includes a unit structure which incorporates a microelectronic element such as, for example, a semiconductor chip, and which optionally can include other structural elements such as a unit substrate. The unit structure has a periphery. For example, where the unit structure includes only a chip, the periphery of the chip constitutes the periphery of the unit structure. Where the unit structure includes a unit substrate, the unit substrate typically defines the periphery of the unit structure. The microelectronic element has a first contact on said microelectronic element. The unit desirably also includes first and second redistribution conductive pads disposed near the periphery of structure, a first redistribution conductor connected to the first redistribution conductive pad and a second redistribution conductor connected to the second redistribution conductive pad. The first and second conductors desirably extend toward the first contact. The first and second conductors are electrically connected to one another adjacent the first contact so as to form a conductive path extending between the first and second redistribution conductive pads, and this conductive path is electrically connected to the first contact. For example, the connection between the first and second conductors may be formed by an interconnect element separate from the first contact, the interconnect element being connected by a short stub connection to the first contact. Alternatively, the connection between the first and second conductors may be made by connecting these conductors directly to the first contact.

A further aspect of the invention provides a package which includes a plurality of units as discussed above and package terminals. The conductive paths of the various units are connected between the package terminals. For example, the structures of the units may be superposed on one another in a stacked arrangement. As discussed in greater detail below, units and packages in accordance with certain embodiments of the invention can have no stubs, or only very short stubs, and hence can minimize or eliminate the adverse effects associated with stubs.

BRIEF DESCRIPTION OF THE DRAWINGS

FIG. 12 illustrates a perspective view of a microelectronic package in accordance with yet another embodiment of the present invention.

DETAILED DESCRIPTION

Figure 1:
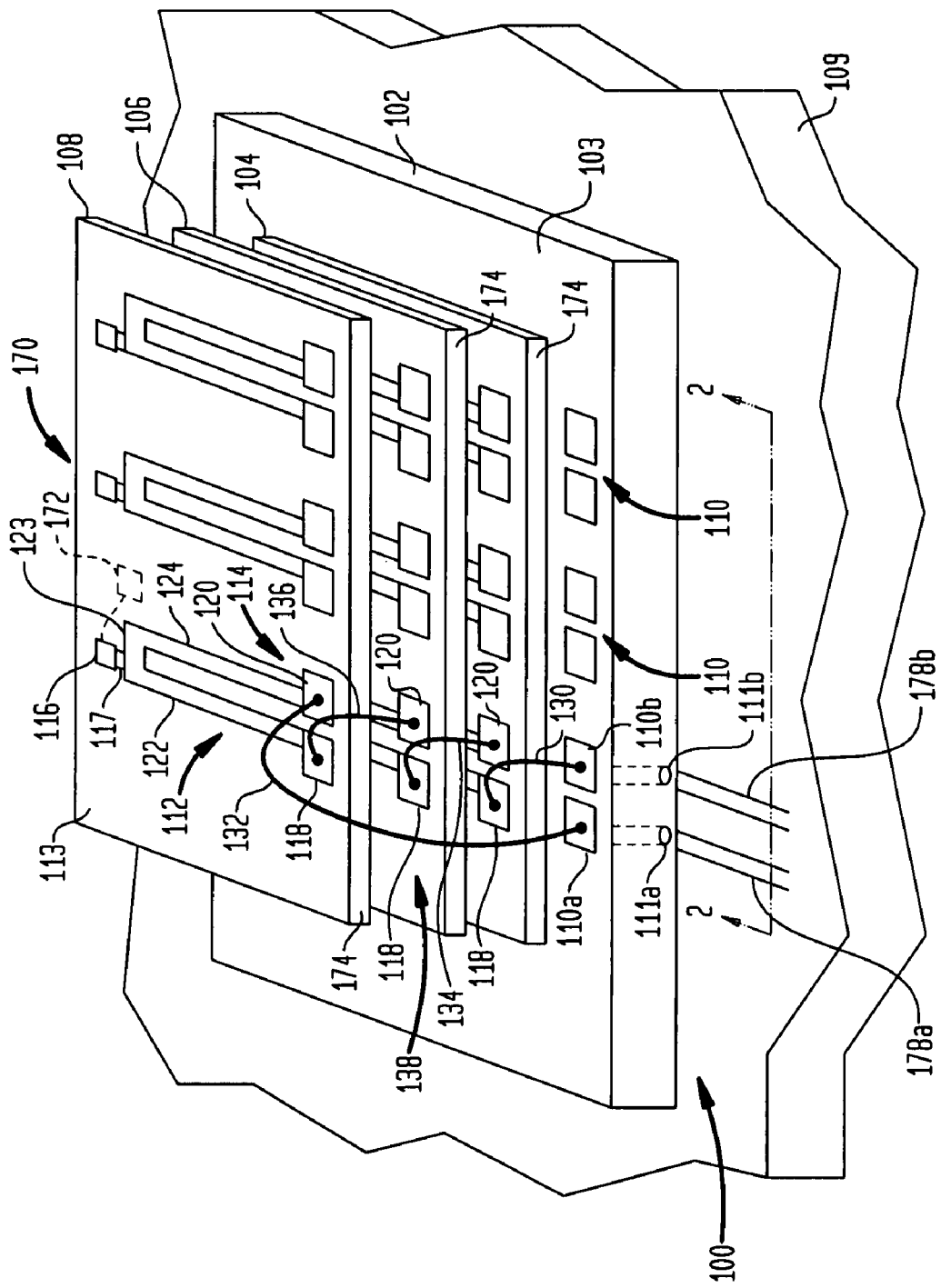
FIG. 1 illustrates a perspective view of a microelectronic package configured to communicate over a serial transmission line in accordance with an embodiment of the present invention.
Figure 2:
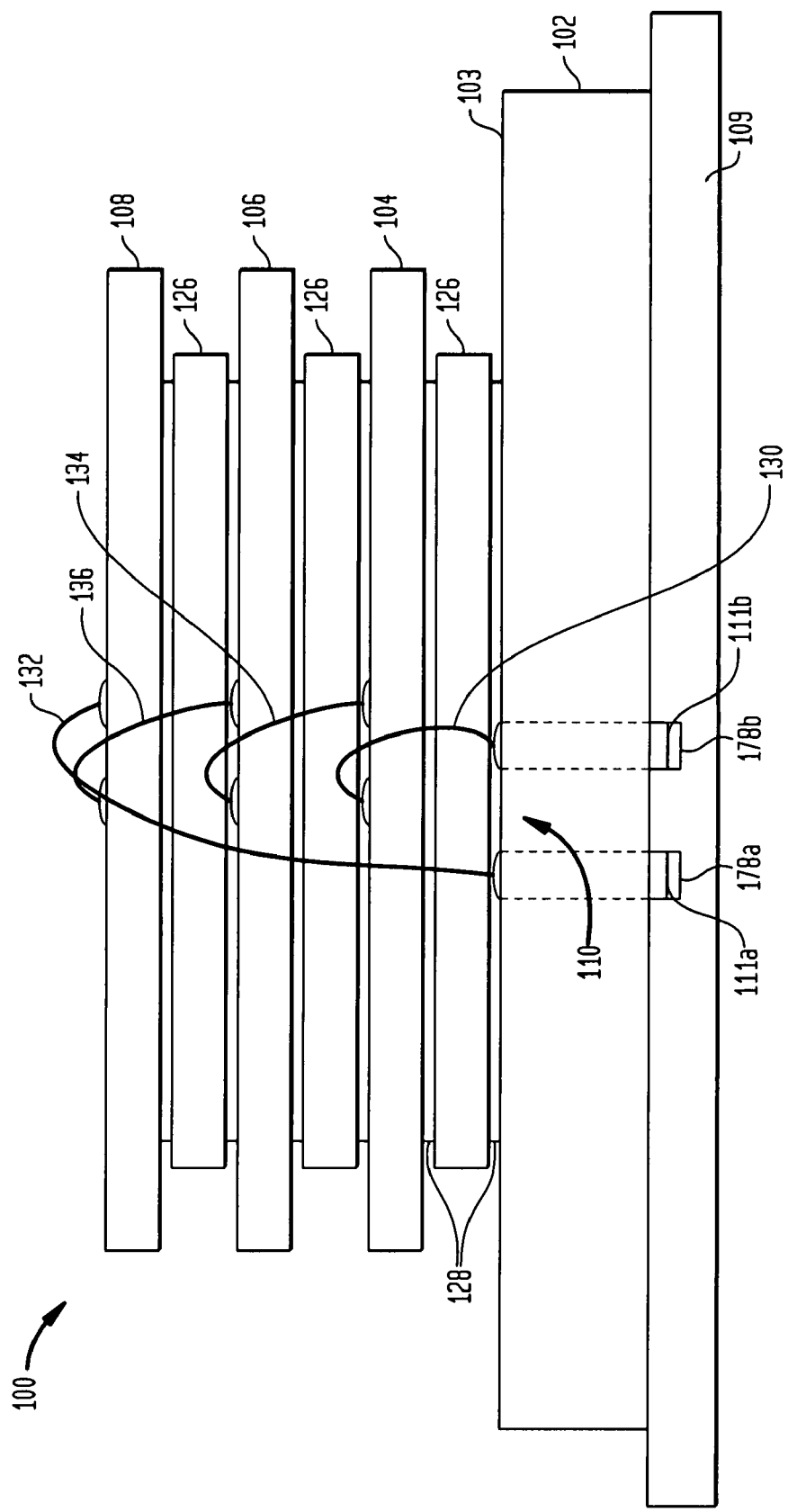
FIG. 2 illustrates an elevational view of the microelectronic package of FIG. 1 taken along line 2-2.

Referring to FIGS. 1 and 2, shown is a microelectronic package 100 in accordance with one embodiment of the invention. The package 100 includes a plurality of units 104, 106, 108. In this embodiment, the structure of each unit includes a microelectronic element such as a semiconductor chip having a unitary body 170 with electrical circuits disposed within the body, one such circuit being schematically indicated at 172. Unit 108, depicted at the top in FIG. 1, has a first contact 116 exposed at a front or first surface 113 of body 170. Contact 116 is electrically connected to the internal circuitry 172 within the interior of the chip.

Unit 108 also includes first and second redistribution pads 118 and 120 exposed at the front surface 113 of body 170. Pads 118 and 120 are disposed remote from first contact 116, and lie near a first edge 174 of body 170 and hence near the periphery of the structure forming unit 108. Unit 108 also includes a first redistribution conductor 122 connected to first redistribution pad 118 and a second redistribution conductor 124 connected to the second redistribution pad 120. The redistribution conductors extend from redistribution pads 118 and 120 toward first contact 116. Redistribution conductors 122 and 124 are connected to one another by an interconnect element 123 disposed adjacent to first contact 116 and remote from the redistribution pads 118 and 120. Thus, the redistribution conductors 122 and 124, together with the interconnect element 123, form a first conductive path 112 connecting the first and second redistribution pads 118 and 120 with one another. Stated another way, path 112 connects a first pair of redistribution pads 114 including pads 118 and 120 to one another.

In the particular embodiment shown, path 112 is connected to contact 116 by a very short stub conductor 117 which extends between the interconnect element 123 and the first contact 116. The redistribution conductors 122 and 124 and the interconnect element desirably have low impedance. For example, the redistribution conductors may have cross-sectional area many times greater than the very fine conductors typically used within the internal structure of the semiconductor chip itself. Also, the redistribution conductors may be formed from materials different from those used within the internal structure of the chip itself. For example, the chip body may include one or more passivation layers defining the front surface 113, and the redistribution conductors may be formed after deposition of one or more of the passivation layers, so that the metal constituting the redistribution conductors is isolated from the internal structure of the chip. This facilitates use in the redistribution traces of metals such as copper which may be incompatible with the processes used to fabricate internal elements of the chip.

Chip or unit 108 has numerous other contacts and other pairs of redistribution pads with conductive paths similar to path 112 discussed above. Only three contacts and three conductive paths are depicted in FIG. 1 for clarity of illustration. The other units 104 and 106 are identical to unit 108.

The package according to this embodiment further includes a package substrate 102. Package substrate 102 includes a first contact pad 110a and a second contact pad 110b, a first terminal 111a electrically connected to the first contact pad 111a and a second terminal 111b electrically connected to the second contact pad 110b. Terminals 111 are adapted for connection to an external circuit element such as a circuit panel. For example, package substrate 102 can be a conventional IC package substrate such as a ball grid array (BGA) substrate, pin grid array (PGA) or the like. Terminals 111 may be formed integrally with contact pads 111 or may be formed separately from the contact pads. Merely by way of example, in a BGA substrate, a single piece of metal may have an upwardly-facing surface exposed at the top surface of the substrate defining one of the contact pads and a downwardly-facing surface exposed at the bottom surface of the substrate defining one of the terminals.

Units 104, 106 and 108 are arranged in a stack atop substrate 102, with the front or first surface 113 of one unit facing upwardly toward the bottom or rear surface of the next higher unit in the stack. In the particular embodiment depicted, the units are staggered with respect to one another. As best seen in FIG. 1, middle unit 106 is offset slightly from bottom unit 104 in the direction toward the rear of the drawing, so that the first edge 174 of middle unit 106 is offset from the first edge 174 of bottom unit 104, and so that the edge region of bottom unit 104, bearing redistribution contacts 118 and 120 is not covered by unit 106. Likewise, top unit 108 is offset from middle unit 106, leaving the edge region of middle unit 106 uncovered. The bottom unit 102 is placed so that its first edge 174 is close to the contact pads 110 of the substrate but does not cover the contact pads.

Non-conductive spacers 126 (FIG. 2) are placed between the chips of the units in the stack, and between bottom unit 104 and package substrate 102 to provide spacing between the chips as well as between the chips and the substrate. The spacers also allow clearance for the conductors between adjacent chips. The spacers 126 can be made of dielectric material such as polyimide or other similar material and can include thermally conductive material. The chips 104, 106, 108, substrate 102 and spacers 126 may be mounted to one another using an adhesive 128 such as epoxy or other mounting technique. The package substrate 102 and the units 104, 106, 108 form a package 100. The elements of the package, including the units, the package substrate and the electrical interconnections discussed below, optionally may be encapsulated as by epoxy over-molding (not shown) or other encapsulants.

In this embodiment, the units 104, 106, 108 are electrically connected in a serial transmission line 138. The transmission line comprises interconnect conductors 130, 132, 134, 136 in the form of wire bonds, in combination with the first conductive path 112 on each of the units. The first interconnect conductor 130 is electrically connected between a contact pad 110b of the package substrate 102 and a first redistribution conductive 118 pad of the pair of redistribution conductive pads 114 of the first or bottom unit 104. A second interconnect conductor 132 is electrically connected between a second contact 110a of the pair of pads on substrate 102 and a second redistribution conductive pad 120 of the third or top unit 108. The third interconnect conductor 134 is electrically connected between a second redistribution conductive pad 120 of the first chip 104 and a first redistribution conductive pad 118 of the second or middle unit 106. In a similar manner, the fourth conductor 136 is electrically connected between a second redistribution conductive pad 120 of the second or middle unit 106 and a first redistribution conductive pad 118 of the third or top unit 108.

The package 100 as described above is shown in FIGS. 1 and 2 in an assembly with a circuit panel 109 such as a circuit board having a pair of conductive features such as traces 178a and 178b. These traces may connect to other components (not shown) of a larger circuit. In the assembly as shown, package substrate 102 is mounted on the circuit panel, with terminals 111a and 111b connected to conductive features 178a and 178b, respectively.

Figure 3:
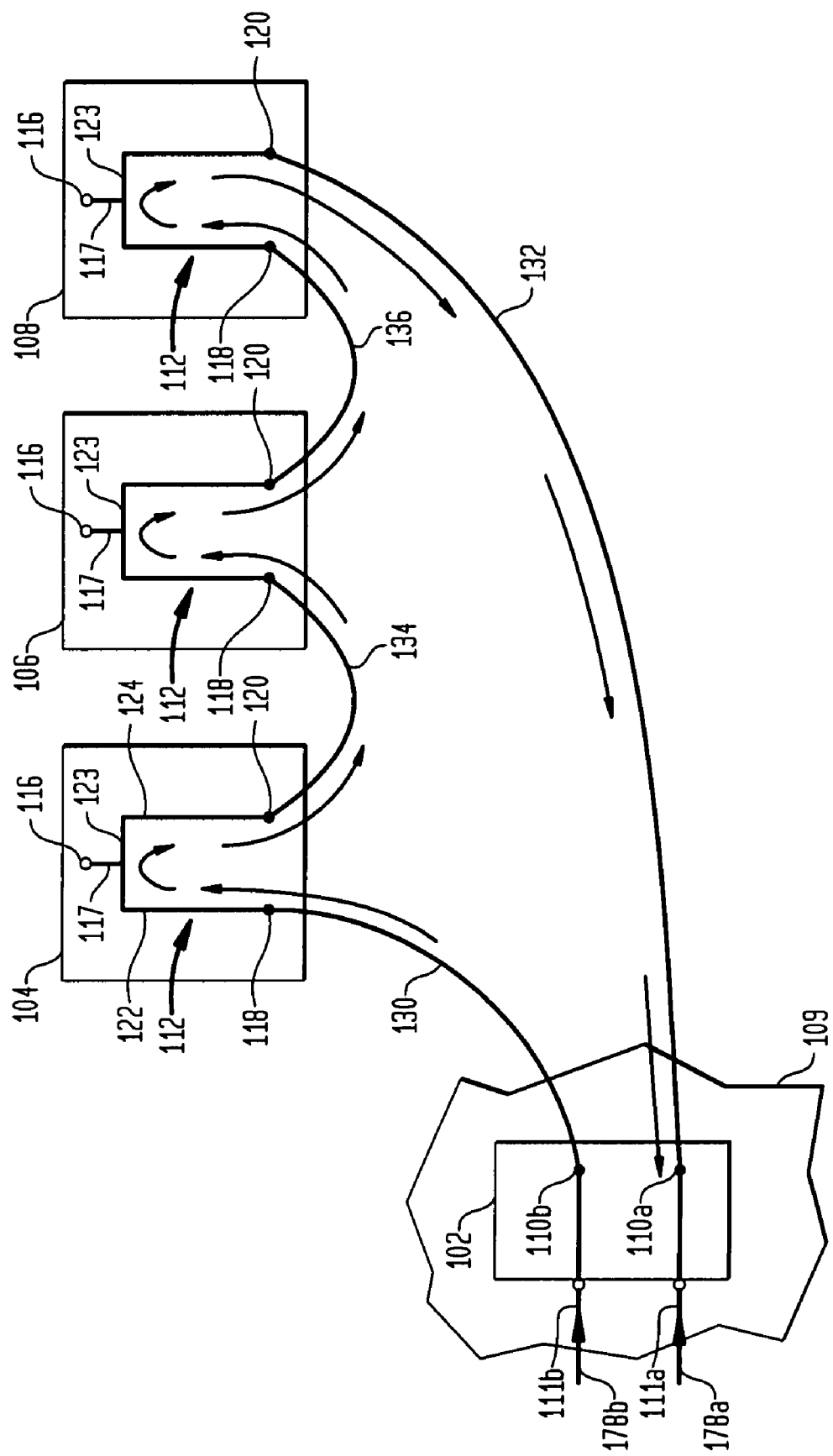
FIG. 3 illustrates a schematic diagram of the microelectronic package of FIGS. 1 and 2.

FIG. 3 illustrates a schematic diagram of the package 100 of FIGS. 1 and 2. Transmission line 138 is connected by terminals 111a and 111b between conductive features 178b and 178a of the circuit panel. In operation, an electrical signal applied to transmission line 138 propagates from contact pad 110b through conductor 130 and through the first conductive path 112 of the first unit 104, then through conductor 134 and the first conductive path 112 of second unit 106, and finally through conductor 136 and the first signal path 112 of the third unit 108 and conductor 132 to contact pad 110a. The propagating signal does not encounter a dead-end or stub, and hence does not create appreciable reflected signals. The signal passing through the conductive path 112 of each unit also passes along the stub 117 to the first contact 116 of the chip in such unit, and into the internal circuitry of the chip. However, because stub 117 is very short, any signals reflected at the end of the stub are nearly in phase with the signal passing along the conductive path. This mitigates or substantially eliminates the adverse effects of the reflected signals. Moreover, the short lengths of the stubs reduce radiation of signals from the stubs. The short stubs are provided even though the contacts 116 of the chips incorporated in the unit are remote from the first edge 174 where the connections between the unit and circuits external to the unit are made. Certain semiconductor chips are made with contacts disposed in one or more rows remote from the edges of the chip as, for example, a single row of contacts extending in the center of the chip. Redistribution conductive pads and conductive paths as shown can be added using a few processing steps at the end of the normal wafer processing cycle used to make such chips. This allows transformation of chips originally designed with rows of contacts remote from the edges into chips with connections near the edges, without extensive redesign of the chip and processing operation, and without creating long stubs.

The interconnect conductors 130, 132, 134, 136 included in the transmission line 138 can be wire bonds as depicted in FIGS. 1 and 2, or can be formed as parts of a flexible circuit tape, or can include any other form of conductor. Three units 104, 106, 108 are shown for illustrative purposes but any number of units, including a single unit or more than three units, can be used. A single transmission line 138 has been shown for simplicity but a plurality of transmission lines can be used. The conductive paths 112 are shown as having a single contact connected to two redistribution conductive pads 118, 120. However, it is contemplated that the conductive paths can have a different number of contacts and conductive pads. For example, two or more contacts can be connected to a given conductive path, and a given conductive path can include three redistribution conductive pads. In addition, the shape of the conductive path is shown in FIG. 1 as generally U-shaped. However, other configurations are possible. For example, the conductors 122, 124 are shown as having a straight shape but they can be curved, serpentine or another shape.

In an alternative embodiment, the package substrate 102 is itself a circuit board having conductive features for mounting and connecting other components. The chips included in units 104, 106, 108 and the substrate 102 are shown as generally flat, rectangular body structures with planar surfaces but it is contemplated that the structures can have other shapes such as square shape and other surfaces such as irregular, stepped or other.

Figure 4:
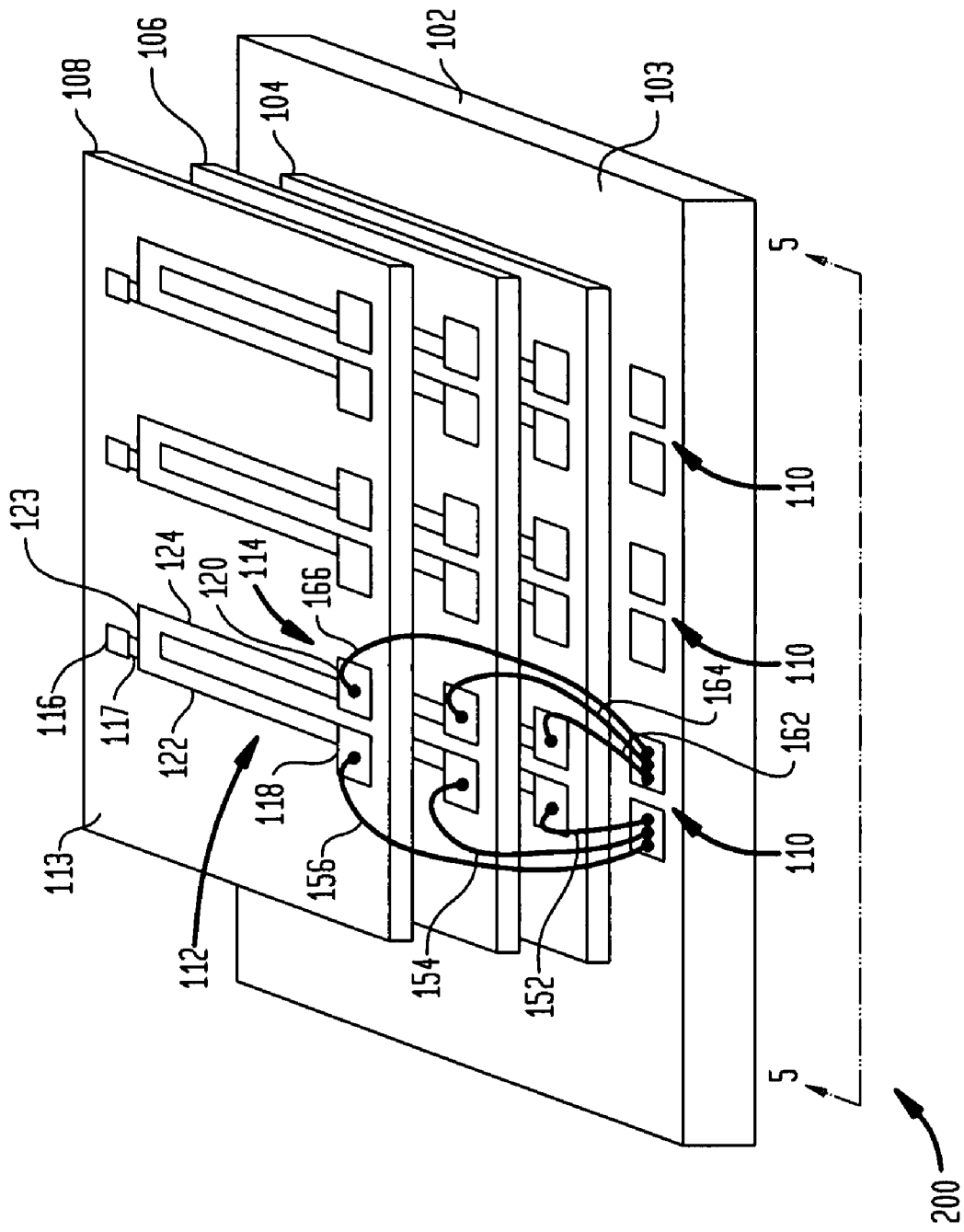
FIG. 4 illustrates a perspective view of a microelectronic package configured to communicate with a parallel transmission line in accordance with an embodiment of the present invention.
Figure 5:
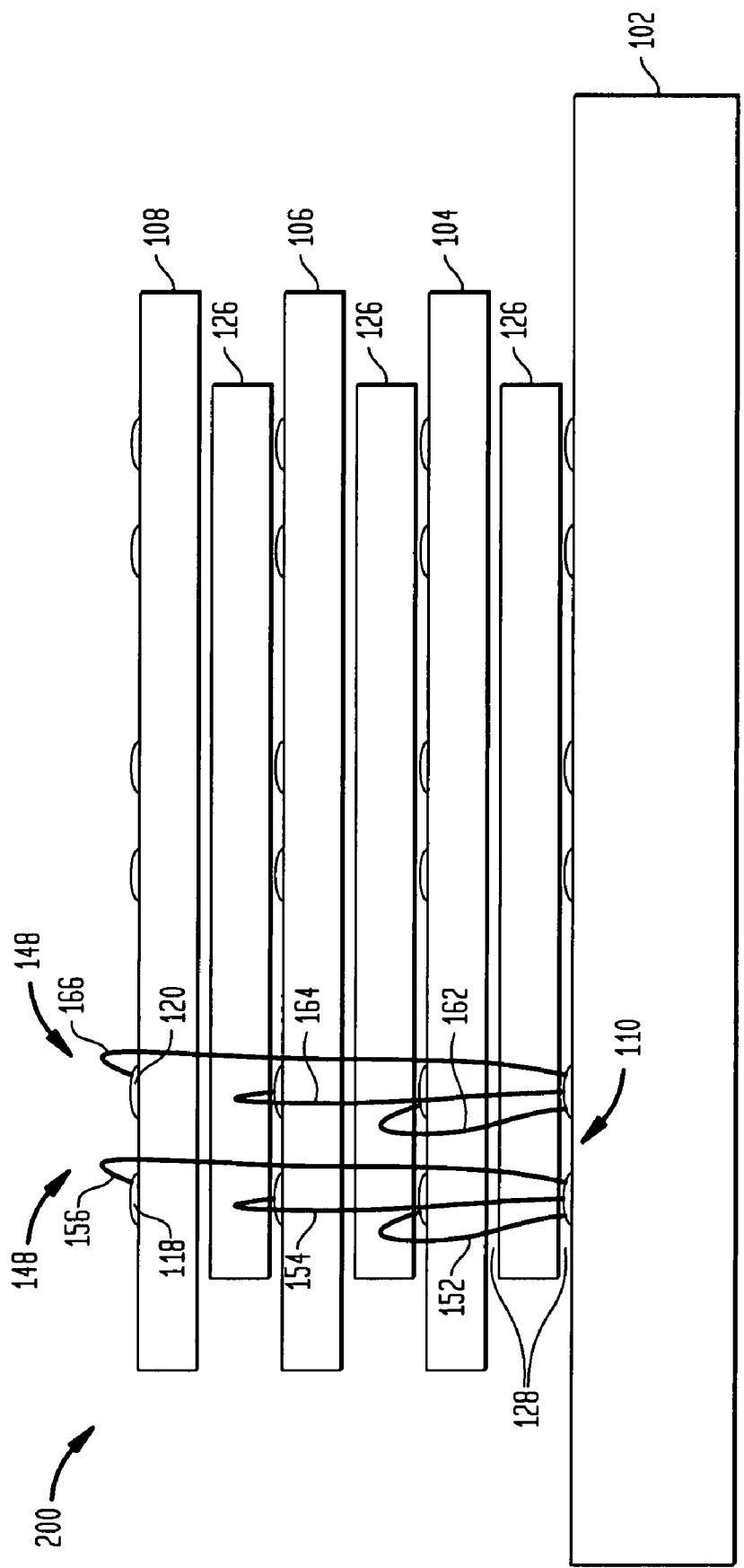
FIG. 5 illustrates an elevational view of the microelectronic package of FIG. 4 taken along line 5-5.

Referring to FIGS. 4 and 5, shown is a microelectronic package 200 in accordance with another embodiment of the present application. The package 200 has units 104, 106, 108 disposed on each other and over package substrate 102 in a similar manner as in package 100 of FIGS. 1-3. The individual units, package substrate and physical arrangement are identical to the corresponding features of the embodiment discussed above with reference to FIGS. 1 and 2. Thus, the chips constituting units 104, 106, 108 each have individual conductive paths 112 identical to conductive paths 112 discussed above. However, in the package 200 of FIGS. 4 and 5, the conductive paths are electrically connected in parallel between the contact pads 110 of the package substrate, rather than in series as discussed above, so that the conductive paths 112 of the units and the interconnect conductors constitute a parallel transmission line 148. In particular, interconnect conductors 152, 154, and 156 are electrically connected between a first contact pad 110 of package substrate 102 and the first redistribution conductive pad 118 of the first, second and third chips 104, 106, 108, respectively. Interconnect conductors 162, 164 and 166 are connected between the other contact pad 110 of the substrate and the second redistribution pads 120 of the chips 104, 106, 108, respectively.

Figure 6:
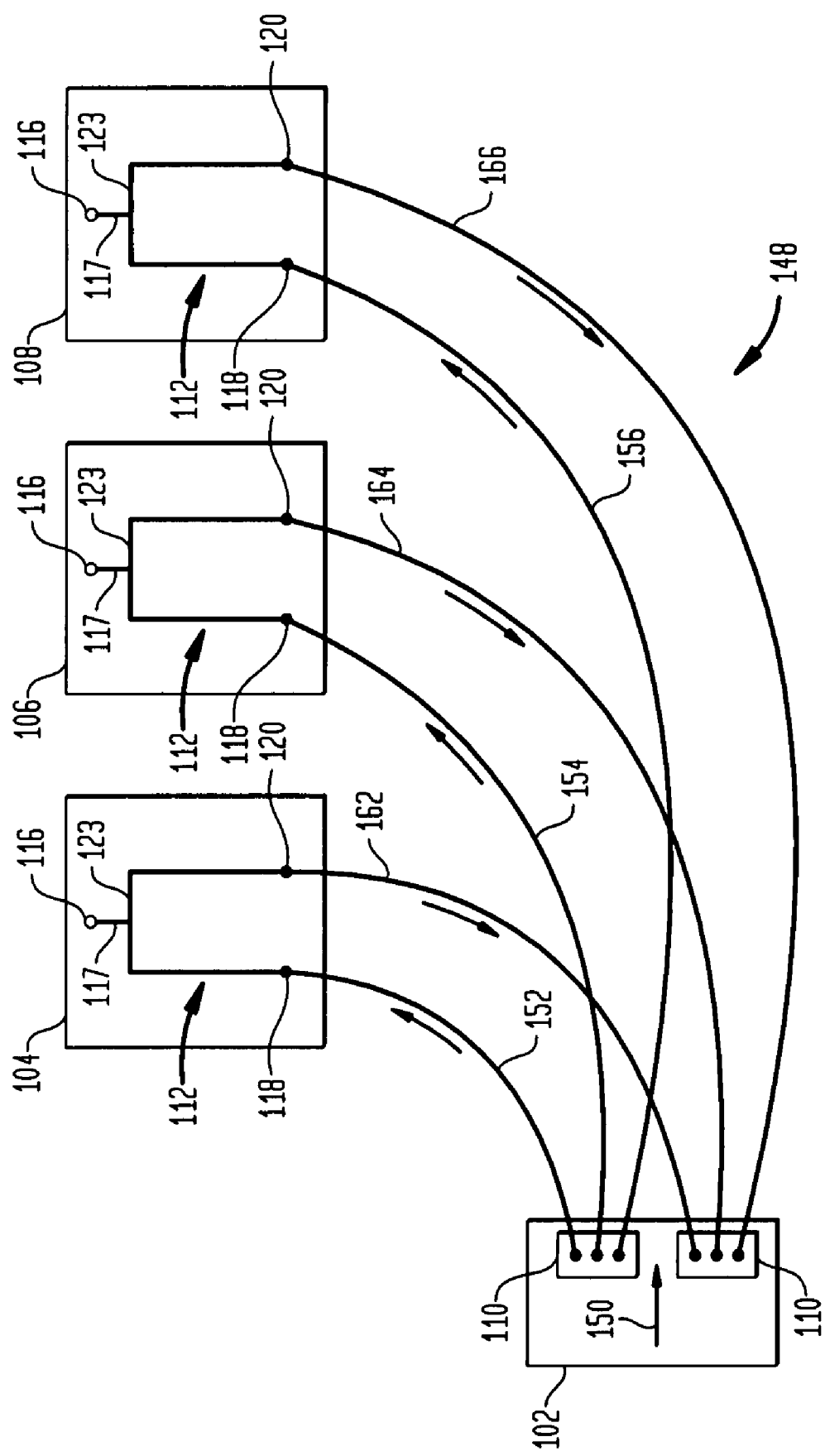
FIG. 6 illustrates a schematic diagram of the microelectronic package of FIGS. 4 and 5.

FIG. 6 illustrates a schematic diagram of the microelectronic package of FIGS. 4 and 5. In operation, an electrical signal 150 is applied to the transmission line 148 at the two contact pads 110 of the substrate 102. The signal 150 propagates in a parallel manner to the conductive path 112 of the first unit 104 via a first path formed from the first conductor 152 and the redistribution conductive pad 118 and returns via the second redistribution conductive pad 120 and conductor 162. Likewise, the same signal propagates in a parallel manner to the second unit 106 and the third unit 108. Thus, the configuration of the conductive paths 112 along with the transmission line allows a signal to propagate in a parallel manner to the chips 104, 106, 108. The features and advantages of the package 200 are similar to those of the package 100 of FIGS. 1-3 and thus are not described for simplicity.

Figure 7A:
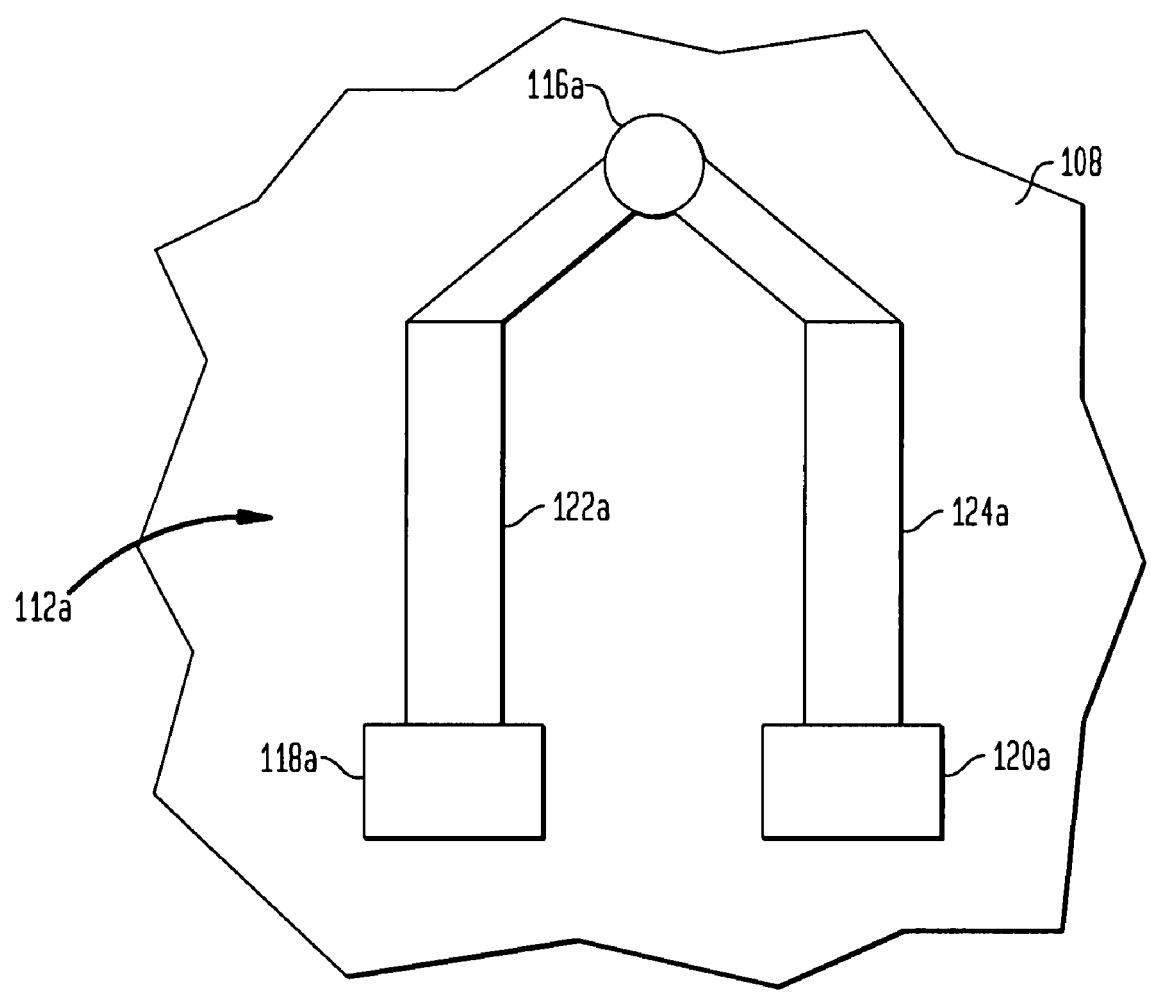
FIGS. 7A-7C illustrate conductive path structures according to other embodiments of the present application.
Figure 7B:
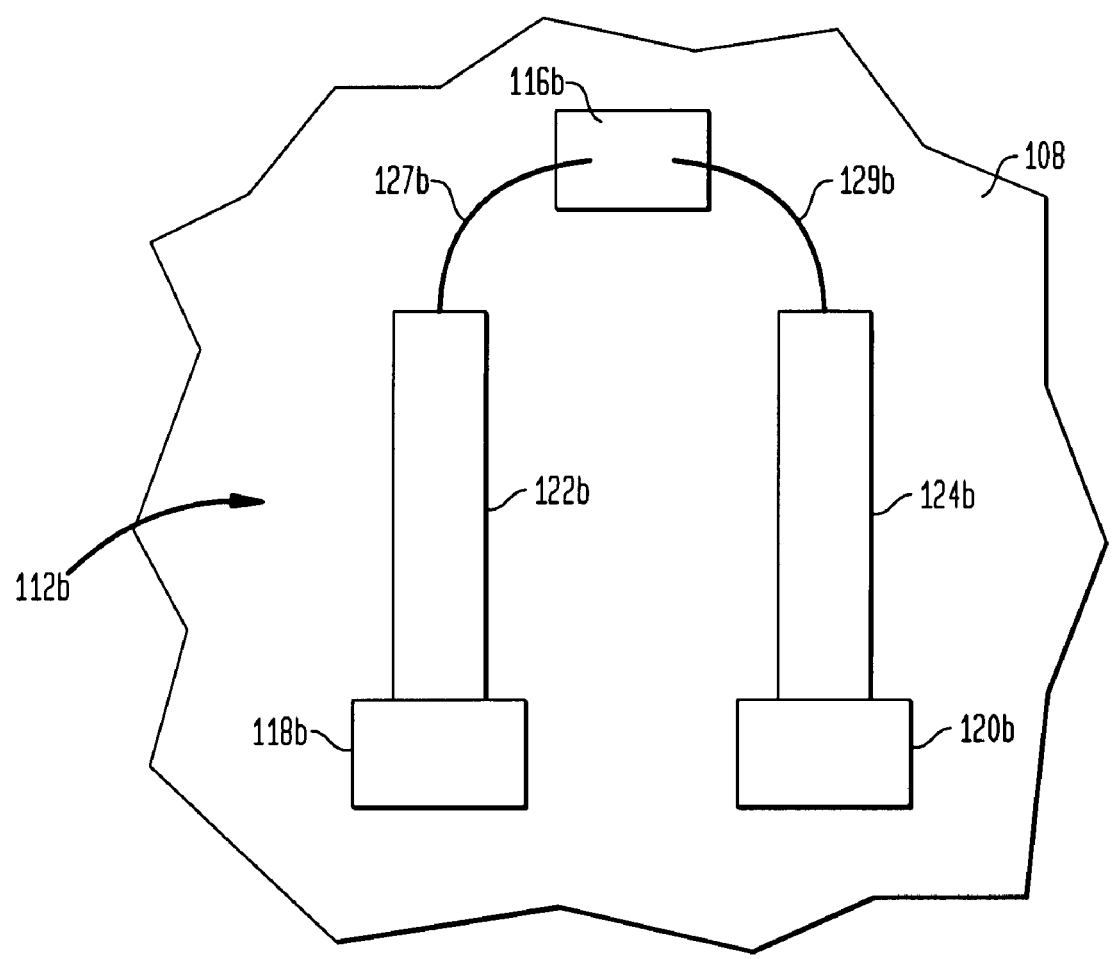
Figure 7C:
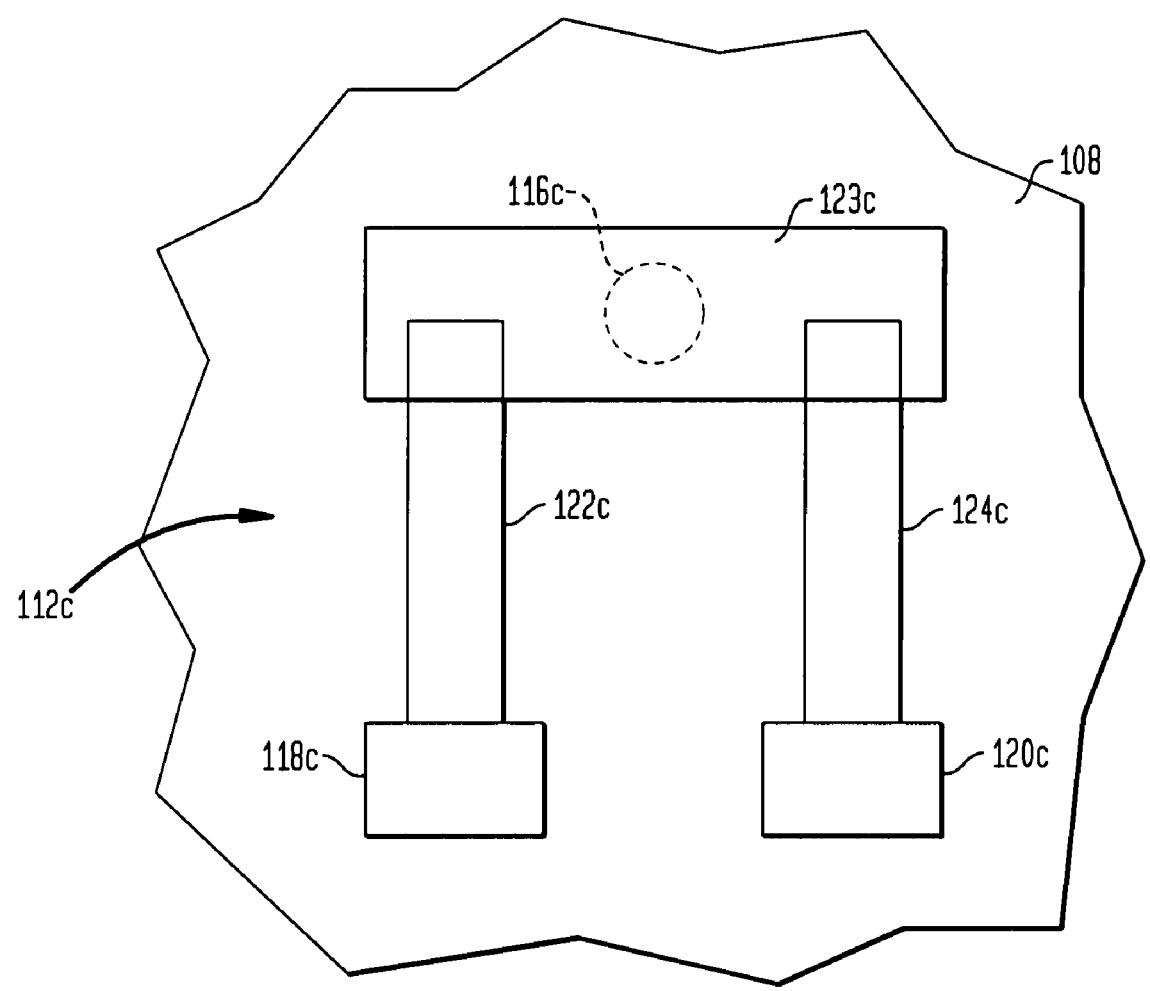

FIGS. 7A-7C illustrate conductive path structures according to other embodiments of the present application.

FIG. 7A shows a conductive path 112a similar to the structure 112 of FIG. 1. For example, structure 112a includes a first redistribution conductive pad 118a with a first conductor 122a extending towards contact 116a and a second redistribution conductive pad 120a with a second conductor 124a extending towards the contact 116a. Contact 116a, like contact 116 of FIG. 1, is electrically connected to the internal circuitry (not shown) within the interior of the chip. However, in the embodiment of FIG. 7A, the first conductor 122a is connected to the contact 116a and the second conductor 124a is connected to the contact 116a. In this embodiment, the conductors 122a and 124a are connected to one another only by the contact 116a, so that the signal path 112a between the redistribution contacts extends through the pad itself. Thus, there is no stub at all.

FIG. 7B shows a conductive path 112b similar to the conductive path 112a of FIG. 7. For example, structure 112b includes a first redistribution conductive pad 118b with a first conductor 122b extending towards contact 116b and a second redistribution conductive pad 120b with a second conductor 124b extending towards the contact 116b. Contact 116b, like contact 116 of FIG. 1, is electrically connected to the internal circuitry (not shown) within the interior of the chip. However, the first conductor 122b includes a main section formed as a trace integral with redistribution conductive pad 118b and an end section 127b formed as a wire bond between the main section and the contact 116. The second conductor 124b is connected to the contact 116b through a similar end second 127b.

FIG. 7C shows a conductive path 112c similar to the structure 112 of FIG. 1. For example, structure 112c includes a first redistribution conductive pad 118c with a first conductor 122b extending towards contact 116c and a second redistribution conductive pad 120c with a second conductor 124c extending towards the contact 116c. Here again, an interconnect element 123c connects the ends of the conductors adjacent contact 116c. Contact 116c, like contact 116 of FIG. 1, is electrically connected to the internal circuitry (not shown) within the interior of the chip. In this embodiment, the interconnect element extends directly over contact 116c and is electrically connected to the contact. Thus, no stub is required.

Figure 8:
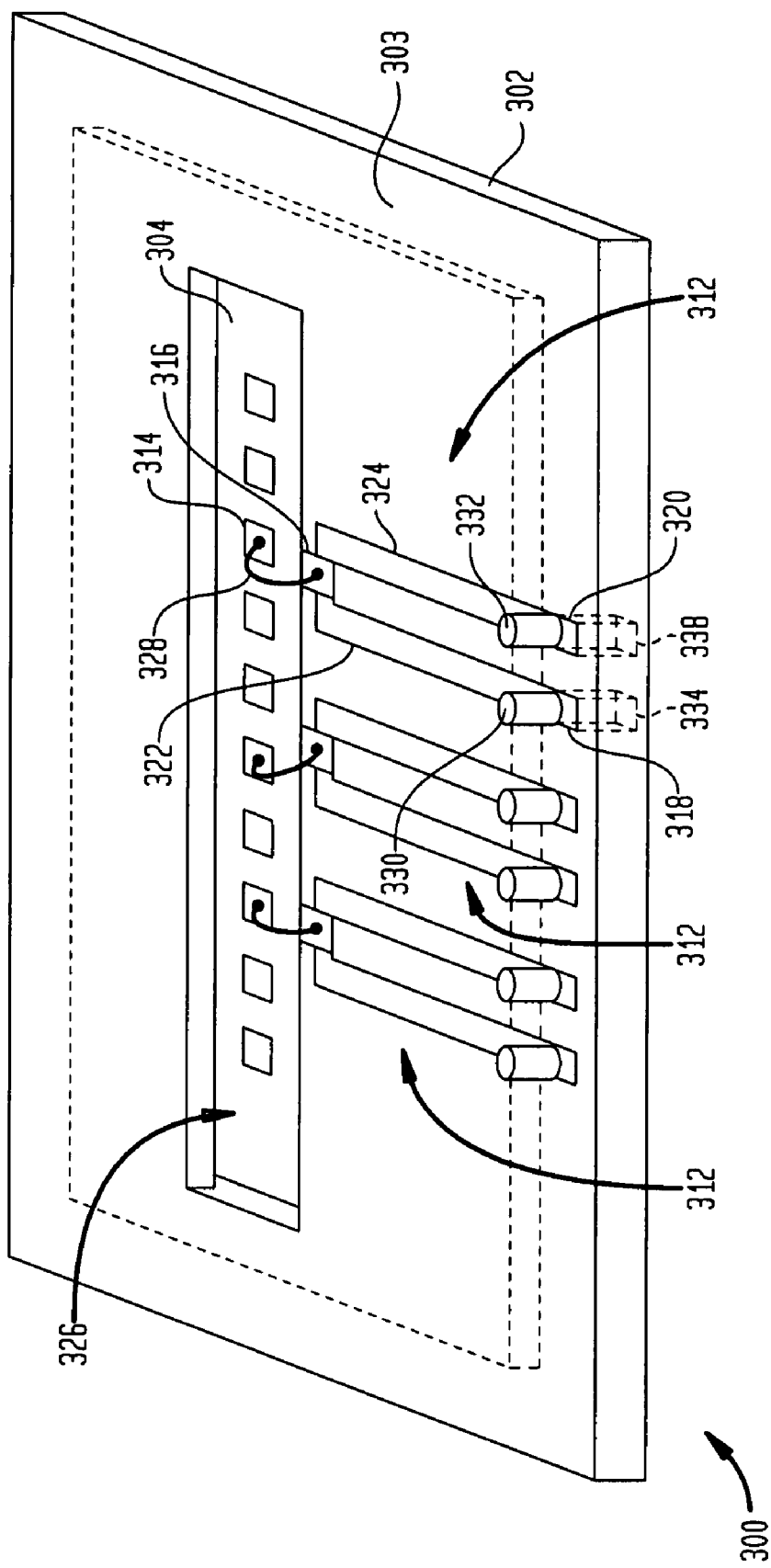
FIG. 8 illustrates a perspective view of a microelectronic unit in accordance with yet another embodiment of the present invention.
Figure 9:
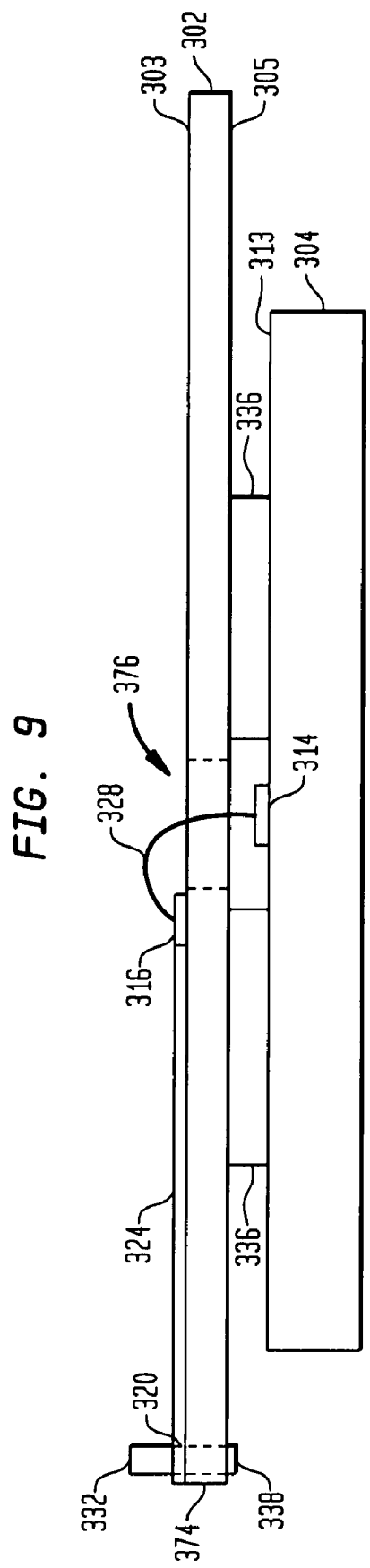
FIG. 9 illustrates an elevational view of the microelectronic unit of FIG. 8.

FIGS. 8 and 9 show a unit 300 in accordance with another embodiment of the present application. In this embodiment, the structure of unit 300 includes a unit substrate 302 and a chip 304. As seen in FIG. 9, the unit substrate is disposed over the front surface 313 of chip 304. In this embodiment, the chip has contacts 314 exposed at its front surface. The unit substrate 302 includes a dielectric element having a front surface 303, a first edge 374 projecting beyond an edge of the chip, and a hole 326 extending through the dielectric substrate remote from the first edge and aligned with the contacts 314 of the chip. In the particular embodiment depicted, the contacts 314 of the chip are arranged in a row, and the hole 326 is in the form of an elongated slot. Non-conductive spacers 336 optionally may be disposed between the chip 304 and the unit substrate 302.

Unit 300 also includes a plurality of conductive paths 312. The conductive paths 312 of unit 300 are similar to the conductive paths 112 of the individual units discussed above with reference to FIGS. 1 and 2. In this embodiment, however, the conductive paths 312 of unit 300 are disposed principally on unit substrate 302 rather than on the chip. Each conductive path 312 includes first and second redistribution conductive pads 318, 320 exposed at the front surface 303 of the unit substrate and disposed near the periphery of the unit substrate, adjacent first edge 374 in a region of the unit substrate which projects beyond chip 304. The first redistribution conductive pad 318 is connected to a first conductor 322 extending towards hole 326 and towards a contact 314 of the chip via a conductor 328. Likewise, the second redistribution conductive pad 320 is connected to a second conductor 324 extending towards and electrically connecting to the contact 314 of the chip. Although conductors 322 and 324 are depicted as extending on the front surface 303 of the unit substrate, the conductive paths 312 or components thereof such as conductors 322 and 324 can be disposed within the substrate and not exposed on the front surface of the substrate.

The redistribution conductive pads 318, 320 of package 300 include respective conductive posts 330, 332 each having a base connected to the pads and a tip projecting upwardly from the front surface of the substrate. The conductive posts 330, 332 can be formed integrally with the respective conductive pads. The conductive pads 318, 320 are exposed at a bottom surface 305 of the substrate 302 to form bottom side contacts 334, 338 to allow for electrical inter-connection between packages, as explained below in further detail.

In this embodiment as well, the first conductor 322 and second conductor 324 of each conductive path are connected to one another at the ends of the conductors remote from the redistribution conductive pads 318 and 320, by an interconnect element 316. The interconnect element 316 of each conductive path 312 is connected to a contact 314 of the chip by stub in the form of a wire bond 328 extending between the interconnect element and the chip contact.

Figure 10:
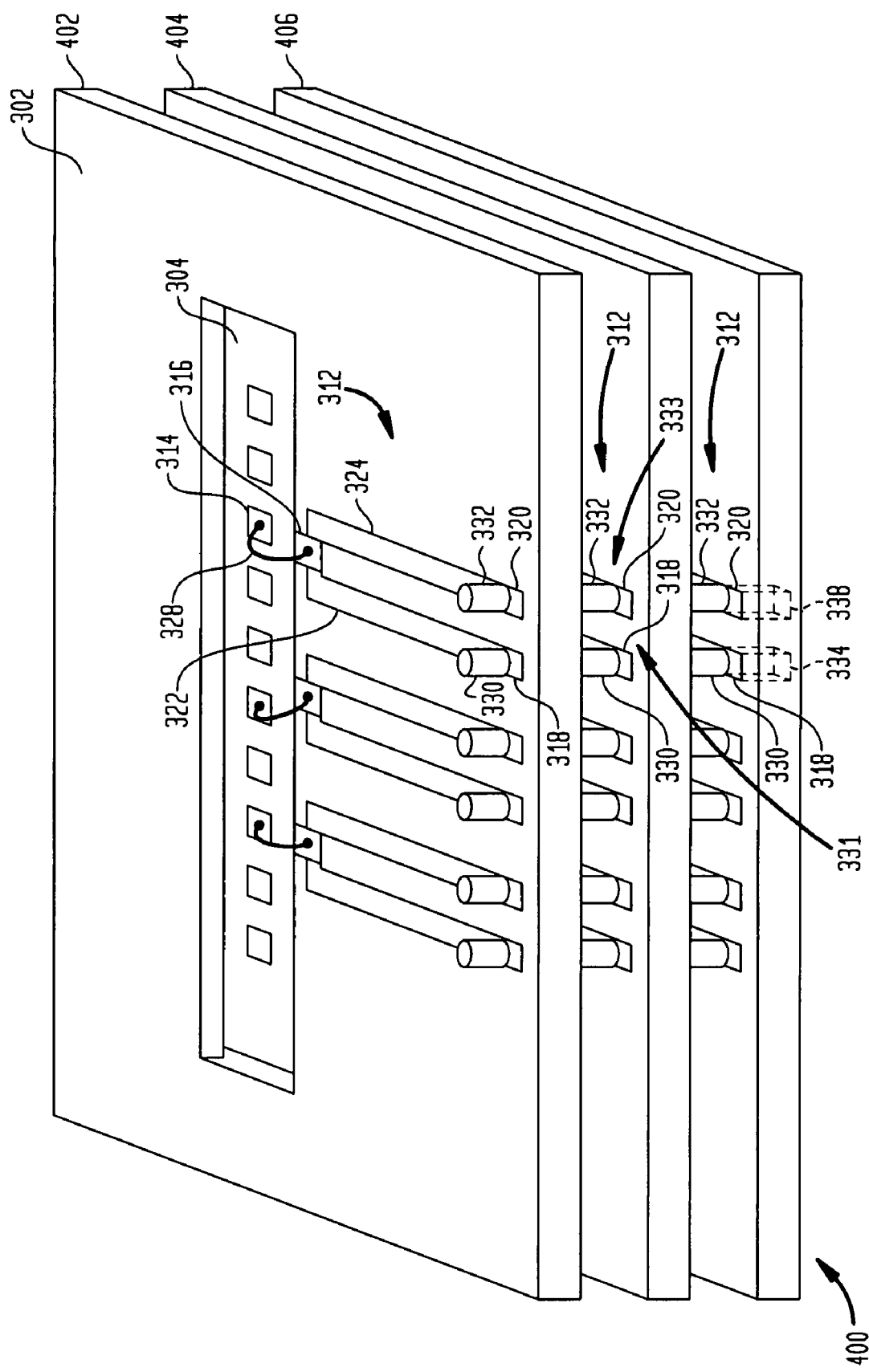
FIG. 10 illustrates a perspective view of a microelectronic package in accordance with another embodiment of the present invention.

FIG. 10 shows a package 400 including a plurality of units 402, 404, 406, each of which has the structure discussed with reference to FIGS. 8 and 9. In this package, the units are stacked one on top of another along a vertical dimension. Thus, the second unit 404 is sandwiched between the first package 402 and the third package 406. The packages 402, 404, 406 are stacked in a manner to align the conductive posts 330, 332 of a lower positioned unit (e.g., unit 404) with the bottom surface contacts 334, 338 of the next higher positioned unit (e.g., unit 402) which allows an electrical connection between the packages. The units are aligned with one another so that the corresponding redistribution conductive pads on the various packages are aligned with one another and connected to one another, as by soldering connections between the posts and the bottom surface contacts. Thus, all of the first redistribution pads 318 are connected to one another to form a first vertical bus 331, whereas all of the second redistribution pads 320 are connected to one another to form a second vertical bus 333.

The posts and bottom surface contacts are only shown diagrammatically in the drawings. The actual physical configuration of the posts, bottom surface contacts and solder connections between these elements may be in accordance with United States Published Patent Application No. 2005/0285246 A1, the disclosure of which is incorporated by reference herein. Also, the posts may project from the bottom surface instead of from the top surface, or from both surfaces. Other types of stackable contacts can be used. For example, as shown in U.S. Pat. Nos. 6,897,565 and 6,977,440, the disclosures of which are incorporated by reference herein, the redistribution conductive pads can be simple flat pads exposed at the top and bottom surfaces of the unit substrate, with the aligned pads being connected to one another by conductive elements such as solder balls interposed between them.

The first conductive paths 312 are connected in parallel between busses 331 and 333. The bottom surface contacts 334 and 338 of the bottom unit 406 (FIG. 10) form terminals for busses 331 and 338, respectively. In use, the package is assembled with a circuit board (not shown), and the terminals or bottom surface contacts of bottom unit 406 are connected to conductive features of the circuit board.

Figure 11:
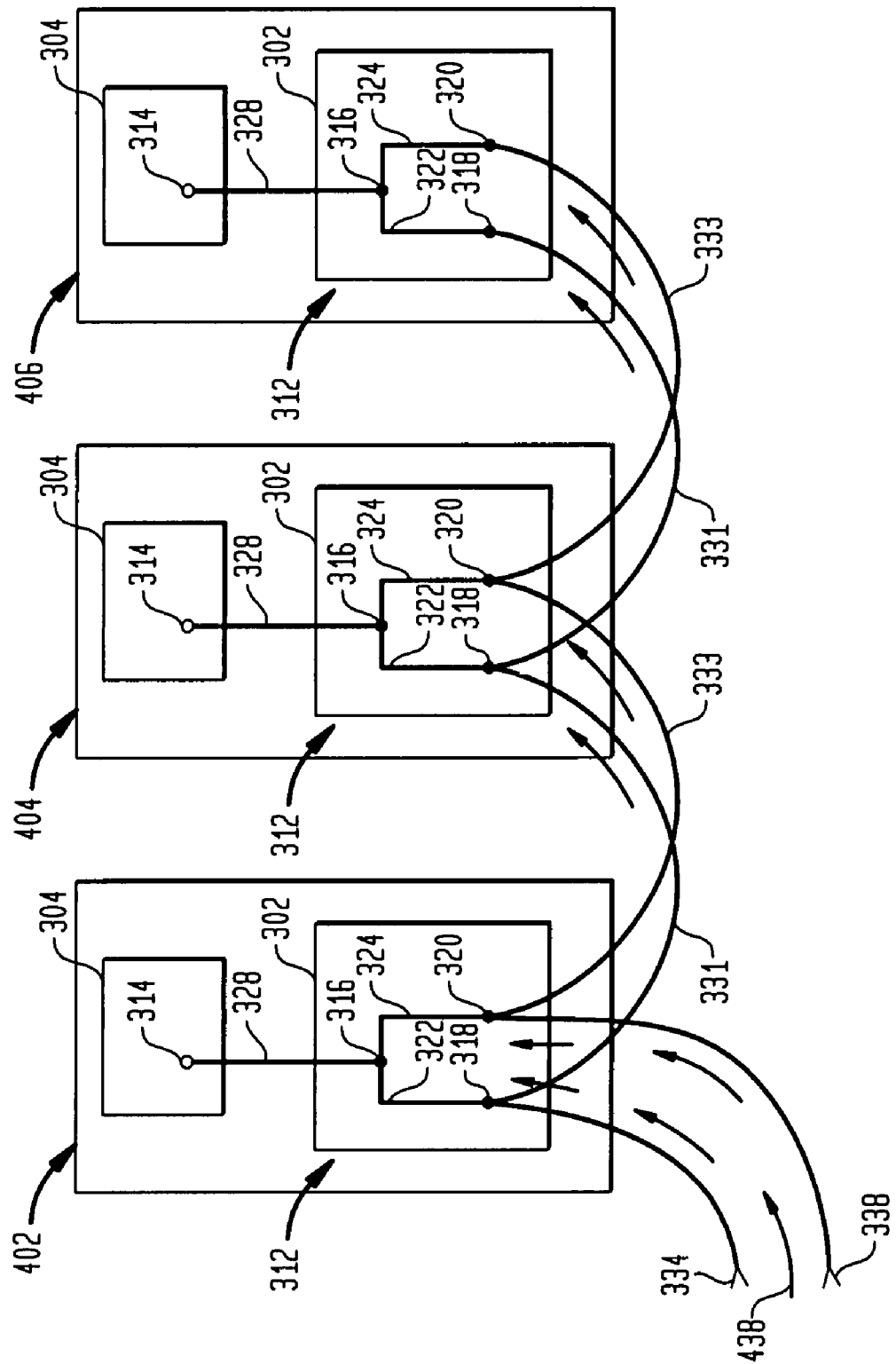
FIG. 11 illustrates a schematic diagram of the microelectronic package of FIG. 10.

FIG. 11 illustrates a schematic diagram of package 400 of FIG. 10. In operation, an electrical signal 438 is applied to the first and second busses 331 and 333, and passes between these busses via the conductive paths 312 of the various units 402, 404 and 406. In this embodiment as well, the signal passing through the conductive paths also passes to the chips via the short stubs 328. Here again, however, the stubs are so short that the adverse effects created by the stubs are minimized.

FIG. 12 shows a microelectronic package 500 in accordance with another embodiment of the present application. However, the package includes conductive elements configured to form a serial transmission line rather than the parallel transmission line of the package shown in FIGS. 10-11. The package 500 comprises a plurality of units 502, 504, 506. Each unit includes a chip 304 and unit substrate 302 substantially identical to the chip and unit substrate discussed above with reference to FIGS. 10 and 11. Thus, each unit substrate has a first conductive path 312 connecting a first redistribution pad 318 with a second redistribution pad 320, such conductive path including conductors 322 and 324 which are connected to one another adjacent the contact 314 of the chip and which are connected to the chip contact 314. Here again, the redistribution pads are disposed in an edge region of the unit substrate, outside of the perimeter of the chip 314. In this embodiment as well, the redistribution pads are exposed at the top and bottom surfaces of the unit substrate. In this embodiment, each unit substrate carries an auxiliary conductive element 332 associated with the conductive path 312 but separate from such path.

Here again, the units are stacked and arranged one on top of another along a vertical dimension, with the corresponding redistribution pads aligned with one another and with the auxiliary conductive elements 332 aligned with one another. In this embodiment, aligned redistribution pads are connected to one another by conductive elements such as metallic posts 330 formed integrally with the redistribution pads as discussed above. However, the conductive elements are provided only at alternate ones of the redistribution pads. The second redistribution pad 320 of the first or bottom unit 506 is connected to the second redistribution pad 320 of the middle unit 504, whereas the first redistribution pad 318 of the second or middle unit is connected to the first redistribution pad 318 of the third or top unit. The first redistribution pad 318 defines a first terminal 570 for connection to a circuit panel. The connected redistribution pads and conductive paths of the various units form a series connection extending from terminal 570, through the conductive path of the first or bottom unit 506 to the second redistribution pad 320 of that unit, then through the second redistribution pad 320 of second or middle unit 504 and through the conductive path of that unit to the first redistribution pad 318 of the middle unit, and then through the first redistribution pad 318 of the top unit 302 and through the conductive path 312 of the top unit to the second redistribution pad 320 of the top unit. The second redistribution pad 320 of the top unit 502 is connected to the auxiliary conductive element of that unit. For example, a wire bond 335 or other connection can be formed at this location before or after the units are stacked and assembled to one another. The wire bond 335 can be attached between a pad electrically connected to the auxiliary conductive element 332 and the second redistribution pad 320. The auxiliary conductive elements 332 are connected to one another, and the bottom unit 506 has a further terminal 572 connected to the auxiliary conductive elements 332. Thus, the conductive paths 312 of the various elements are connected in series between terminals 570 and 572. This package operates in substantially the same manner as the series-connected package discussed above with reference to FIGS. 1-3.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic unit comprising:
    a unit structure including a semiconductor chip, said semiconductor chip including circuitry within an interior of said chip, said unit structure defining a first surface and a periphery;
    a first contact on said semiconductor chip connected to the circuitry; and
    first and second redistribution conductive pads disposed near the periphery of structure;
    a first redistribution conductor connected to the first redistribution conductive pad;
    a second redistribution conductor connected to the second redistribution conductive pad,
    wherein the first and second conductors extend toward and are electrically connected to the first contact and are electrically connected to one another adjacent the first contact so as to form a conductive path extending between the first and second redistribution conductive pads, the conductive path limiting reflection of a signal propagating along the conductive path between the conductive pads and the circuitry within the interior of the chip.

2. The microelectronic unit of claim 1 wherein said redistribution conductive pads and said redistribution conductors are carried on said semiconductor chip.

3. The microelectronic unit of claim 1 wherein said semiconductor chip includes an element body having a front surface, said first contact and said redistribution conductive pads being exposed at said front surface.

4. The microelectronic unit of claim wherein said unit structure includes a dielectric unit substrate and said semiconductor chip, said redistribution conductors and said redistribution conductive pads being carried on said unit substrate.

5. The microelectronic unit of claim 4 wherein said semiconductor chip includes an element body having a front surface, said unit substrate overlying said front surface.

6. The microelectronic unit of claim 1, wherein the first and second conductors comprise copper traces.

7. The microelectronic unit of claim 1 further comprising an interconnect element extending between said first and second conductors adjacent the first contact, said conductive path including said interconnect element.

8. The microelectronic unit of claim 7 further comprising a stub conductor extending between said interconnect element and said first contact so that said conductive path is connected to said first contact by said stub conductor, said stub conductor being shorter than said first and second conductors.

9. The microelectronic unit of claim 7 wherein said interconnect element extends over said first contact and is electrically connected to said first contact.

10. The microelectronic unit of claim 1 wherein said first and second conductors are both connected to said first contact.

11. The microelectronic unit of claim 10 wherein said first and second conductors are connected to one another only by said first contact.

12. A microelectronic package comprising a plurality of units as claimed in claim 1 and first and second terminals, the conductive paths of units being connected between said first and second terminals.

13. The microelectronic package of claim 12 wherein the conductive paths of the units are electrically connected in series between said first and second terminals.

14. The microelectronic package of claim 12 wherein the conductive paths of the microelectronic elements are electrically connected in parallel between said first and second terminals.

15. The microelectronic package of claim 12 wherein said units are superposed on one another in a stack.

16. The microelectronic package of claim 12 further comprising a package substrate, said first and second terminals being carried on said package substrate.

17. The microelectronic package of claim 12 wherein said first and second terminals are adapted for surface mounting to a circuit panel.

18. An assembly including the microelectronic package of claim 12 and a circuit panel having conductive features thereon, the terminals of the package being connected to the conductive features of the circuit panel.

* * * * *

UNITED STATES PATENT AND TRADEMARK OFFICE
CERTIFICATE OF CORRECTION

| | | |
|---|---|---|
| PATENT NO. | : 7,768,117 B2 | Page 1 of 1 |
| APPLICATION NO. | : 11/809214 | |
| DATED | : August 3, 2010 | |
| INVENTOR(S) | : Belgacem Haba, Richard Dewitt Crisp and Masud Beroz | |

It is certified that error appears in the above-identified patent and that said Letters Patent is hereby corrected as shown below:

Column 1, at line 54, after "of" insert --the--.
Column 3, at line 19, after "have" insert --a--.
Column 9, at line 35, after "of" insert --the--.
Column 10, at line 3, after "claim" insert --1--.

Signed and Sealed this
Twenty-sixth Day of July, 2011

David J. Kappos
*Director of the United States Patent and Trademark Office*